Jan. 12, 1960 M. C. KIDD 2,921,206
SEMI-CONDUCTOR TRIGGER CIRCUITS
Filed Dec. 23, 1954

INVENTOR.
MARSHALL C. KIDD
BY H. L. Newton
ATTORNEY

United States Patent Office 2,921,206

Patented Jan. 12, 1960

2,921,206

SEMI-CONDUCTOR TRIGGER CIRCUITS

Marshall C. Kidd, Haddon Heights, N.J., assignor to Radio Corporation of America, a corporation of Delaware Application December 23, 1954, Serial No. 477,258

17 Claims. (Cl. 307—88.5)

This invention relates in general to semi-conductor trigger circuits and in particular to trigger circuits utilizing semi-conductor devices, such as junction transistors, as the active signal translating element thereof.

Trigger circuits find wide use in electronic signal translating and communication equipment of all types as, for example, in various computer systems. They may be used, for example, as voltage wave sources, switches, pulse amplifiers and frequency dividers. With the discovery of the transistor, trigger circuits employing transistors were developed and have been used successfully. Generally, these circuits employ transistors of the current multiplication type (i.e., point contact transistors) and provide both monostable and bistable trigger circuit operation. It is an object of the present invention to utilize characteristics of the type exhibited by junction transistors to provide trigger circuits which are characterized by simple circuit construction and reliable operation.

It is another object of the present invention to provide transistor trigger circuits of simplified construction wherein efficient and stable circuit operation is achieved.

It is another object of the present invention to provide a simple regenerative amplifier circuit which utilizes semi-conductor devices such as junction transistors for reliable and efficient circuit operation.

It is a still further object of the present invention to provide a simple yet reliable transistor trigger circuit which provides efficient bistable or monostable circuit operation.

It is yet another object of the present invention to provide a regenerative pulse amplifier circuit utilizing a junction transistor wherein relatively high gain pulse amplification is obtainable.

It is still another object of the present invention to provide a semi-conductor trigger circuit utilizing a junction transistor as the active signal translating element thereof in which the output pulses are characterized by a very fast rise time.

These and further objects and advantages of the present invention are achieved, in general, in circuits utilizing a transistor having characteristics of the type exhibited by junction transistors. The transistor is biased in such a manner that the biasing voltage between the emitter and base electrodes is in the reverse or non-conducting direction. This bias voltage is opposite to that which is normally applied between these electrodes. The bias voltage applied to the collector is relatively large and near collector breakdown and is in the reverse or relatively non-conducting direction with respect to the base. This results in a mode of operation referred to as "delayed collector conductivity" and provides characteristics of the transistor wherein bistable or monostable operation are readily achieved. The transistor can then be triggered by applying trigger pulses to one of its base, collector or emitter electrodes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
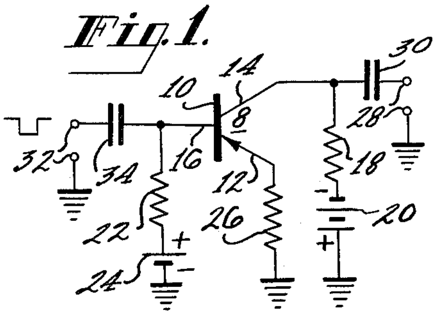
Figure 1 is a schematic circuit diagram of a trigger circuit or regenerative amplifier utilizing a junction transistor in accordance with the invention.

Referring now to the drawing, wherein like parts are indicated by like reference numerals throughout the figures, and referring particularly to Figure 1, a semi-conductor device or transistor 8 includes a semi-conductive body 10 with which three electrodes are cooperatively associated in a well known manner. These are designated, as is conventional, as an emitter 12, a collector 14 and a base 16. In the present example the transistor 8 may be considered to be of the P-N-P junction type. It should be understood, however, that the invention is not necessarily restricted to junction transistors or transistors of any specific conductivity type, and other transistors having characteristics similar to the characteristics of junction transistors and which will be described herein could be used.

To obtain the desired operating characteristics for both bistable and monostable circuit operation, in accordance with the invention, the bias voltage which is applied between the emitter 12 and the base 16 of the transistor 8 is in the reverse or relatively non-conducting direction. The polarity of this bias voltage will, accordingly, be understood to be opposite to the polarity for normal or conventional junction transistor operation.

Accordingly, the base 16 is connected through a resistor 22 to the positive terminal of a source of direct current potential such as illustrated by a battery 24, the negative terminal of which is connected to a point of fixed reference potential or ground for the system as shown. Alternatively, the base 16 could be connected either directly to ground or to ground through the resistor 22. In either of these latter cases, the polarity of the bias voltage between the emitter and base electrodes will be understood to be initially in the reverse or non-conducting direction due to the flow of emitter current through an emitter resistor 26, which is connected between the emitter 12 and ground.

The collector 14 of the transistor 8 is connected through a resistor 18 to the negative terminal of the collector biasing battery 20, the positive terminal of which is grounded. The collector 14 is thereby biased in the reverse or relatively non-conducting direction with respect to the base 16. The polarity of this bias voltage will, accordingly, be understood to be the same as the polarity for normal or conventional transistor operation.

Trigger pulses may be applied to the circuit through a pair of input terminals 32, one of which is grounded and the other of which is connected through a coupling capacitor 34 to the base 16. Output signals may be taken from a pair of output terminals 28, one of which is grounded and the other of which is connected through a coupling capacitor 30 to the collector 14.

In operation, by initially biasing the transistor 8 so that a reverse bias voltage exists between the emitter 12 and the base 16, the emitter is initially at cutoff. As the collector voltage is increased the effective reverse bias between the emitter 12 and the base 16 will be decreased due to the flow of the current $I_{co}$ through the resistor 22 into the base 16. In other words, the increase in the drop in potential across the resistor 22 and the resistance of the base electrode due to the flow of the current $I_{co}$ is in such a direction as to make the base 16 less positive. The current $I_{co}$ is the current which flows when the emitter current is zero. Eventually, a point will be reached at which the net voltage between the emitter 12 and the base 16 of the transistor 8 is zero. At substantially the moment that this net voltage is zero, the collector 14 becomes conductive in the same manner as for normal transistor action. By increasing the collector supply voltage, more collector current will flow and the collector-to-emitter voltage will remain substantially constant. The net bias voltage between the emitter 12 and the base 16 will now be slightly positive or in the forward or relatively conducting direction. This mode of operation is referred to as "delayed collector conductivity."

By operating a transistor as described (i.e., in the so-called delayed collector conductivity mode), it has been found that the emitter current is smaller than the collector current. In other words, the direct current gain as defined by the ratio of collector current to emitter current is greater than unity. Moreover, the alternating current gain as defined by the ratio of collector current increments to base current increments is relatively large, especially when compared with normal junction transistor operation. This alternating current gain will increase as the collector voltage is increased. Another advantage afforded by this type of operation is that the output resistance of the transistor is relatively low.

Figure 2:
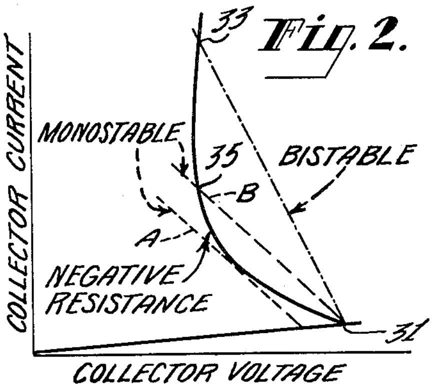
Figure 2 is a graph showing curves relating collector current to collector voltage for a junction transistor of the type used in Figure 1.

The collector characteristic for a typical junction transistor which is biased to be operative in the delayed collector conductivity mode is shown in the graph of Figure 2 where collector current has been plotted against collector voltage. It is seen that the collector current remains substantially constant as the collector voltage is increased up to a certain value (point 31). At this point, which is determined by the particular characteristics of the transistor used and the circuit parameters, the collector current increases rapidly as shown. At this point, the potential between the emitter and base of the transistor is substantially zero. The collector then swings into a high conductivity unstable state and provides a negative resistance characteristic as shown. Finally a stable region of high collector current and constant collector voltage is reached. This collector or output characteristic, which is provided by operating the transistor in the delayed collector conductivity mode, is used in accordance with the invention to provide both monostable and bistable trigger circuits.

In operation, it will be assumed initially that bistable operation is desired. To this end, the load line is selected as shown by the dotted line designated "bistable" in Figure 2 as an example. For bistable operation the capacitor 34 will preferably be eliminated and the ungrounded input terminal 32 will be connected directly with the base 16. The transistor 8 is initially biased at cutoff near the point 31 on the collector characteristic curve. This point, it will be understood, is a stable operating point. When a negative trigger pulse is applied to the base 16, however, the operating point shifts into the negative resistance region, which is highly unstable. The trigger pulse will normally be from three to five volts and may be of any suitable type, such as a square wave or a sine wave. Thus, by virtue of the high current gain between the collector and the base of the transistor, regeneration takes place.

The collector current continues to rise rapidly until the point 33 is reached which is the stable saturation region or constant voltage region. Upon the application of a trigger pulse of an opposite polarity to the first trigger pulse (for a P-N-P transistor, a positive pulse), the stable operating point 31 is again attained and the cycle repeats upon the application of the next negative trigger pulse to the base 16. While a P-N-P junction transistor is illustrated in Figure 2, opposite conductivity transistors could be used, in which case the polarity of the bias supplies would be reversed as would be the polarity of the trigger pulses which are applied to the base.

The type operation described above is often referred to as flip-flop operation, and its applications are numerous. This operation is achieved, moreover, with a transistor having characteristics of the type exhibited by a junction transistor, and the circuit operation is such that stability and efficiency are achieved with relatively simple circuit connections.

While it will be understood that the circuit specifications may vary according to the design for any particular application, the following circuit specifications are included for the bistable operation of the circuit of Figure 1 by way of example only:

| | |
|---|---|
| Resistors **18**, **22** and **26** | 4700, 90,000, and 1000 ohms, respectively. |
| Battery **24** | 1.5 volts. |
| Battery **20** | 80 volts. |

If it is next assumed that monostable circuit operation is desired, the load line will be chosen, for example, as shown by the dotted line B designated as "monostable" in Figure 2. In addition, the capacitor 34 and the resistor 22 will be chosen to have a relatively small time constant compared with the duration of the applied input pulse. The transistor 8 is also biased initially at cutoff near the point 31 on the collector characteristic curve. This is, it will be understood, a stable low current conduction state. Upon the application of a negative trigger pulse to the base, however, the operating point momentarily shifts into the unstable negative resistance region as shown by the point 35 on the collector electrode characteristic curve. Thus, the circuit becomes highly regenerative and an output pulse may be derived from the output terminals 28. The rise time of this output pulse is extremely fast, and its amplitude is a relatively large percentage of the supply voltage. The operating point then rapidly returns to the stable point 31 of low current conduction.

Thus, by monostable operation a triggered junction transistor regenerative pulse amplifier is obtainable which is stable and efficient in operation and provides pulses having very fast rise times. The cycle described above repeats upon the application of the next negative trigger pulse to the base 16. As in the case of bistable operation, the conductivity of the transistor may be reversed if the polarity of the bias supply and of the trigger pulses is also reversed.

While it will be understood that the circuit specifications may vary according to the design for any particular application, the following circuit specifications are included for monostable operation of the circuit of Figure 1 by way of example only:

| | |
|---|---|
| Resistors **18**, **24** and **26** | 10,000, 90,000, and 1000 ohms, respectively. |
| Battery **20** | 80 volts. |

Figures 3, 4:
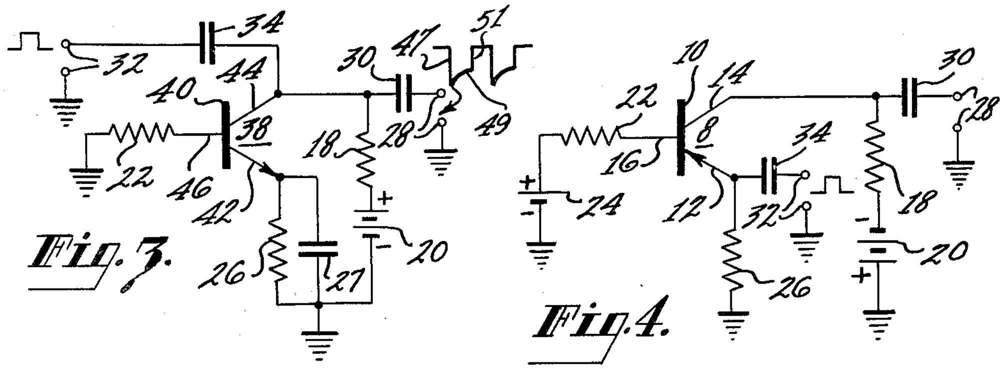
Figures 3 and 4 are schematic circuit diagrams of trigger circuits utilizing junction transistors and illustrating various modifications of the circuit illustrated in Figure 1 in accordance with the invention.

Bistable and monostable trigger circuits may also be provided in which the trigger pulses are applied to the collector of a junction transistor which is biased to operate in the delayed collector conductivity mode. In Figure 3, for example, an N-P-N junction transistor 38 has positive trigger pulses applied to its collector 44 from a pair of input terminals 32, one of which is grounded and the other of which is connected through a coupling capacitor 34 to the collector 44. For a transistor of an opposite conductivity type, the trigger pulses would be reversed in polarity. The transistor 38 includes a semiconductive body 40 with which an emitter 42 and a base 46, in addition to the collector 44, are cooperatively associated.

Another difference of the circuit illustrated in Figure 3 is that the base 46 has been returned to ground through the resistor 22. In this case, the reverse bias between the emitter 42 and the base 26 initially required is derived by the flow of emitter current through the resistor 26, which is preferably by-passed by a by-pass capacitor 27 for monostable circuit operation. For bistable circuit operation the capacitor 27 will preferably be eliminated from the circuit. The base 46 could, of course, be connected to the negative terminal of the battery through the resistor 22. In operation, the circuit illustrated in Figure 3 operates in much the same manner as the circuit illustrated in Figure 1. It has been found, however, that, in general, higher gain operation is obtained if base triggering is utilized.

Accordingly, if bistable circuit operation is desired for a circuit of the type illustrated in Figure 3, the load line will be chosen as shown in Figure 2. The operating point will then initially be chosen near the point 31. Upon the application of a positive trigger pulse to the collector 44 through the capacitor 34, or directly to the collector 44 since for bistable operation the capacitor 34 may be eliminated, the operating point shifts into the negative resistance region. The collector current then continues to rise rapidly until the stable region of constant voltage (point 33) is reached. Upon the application of a trigger pulse of a negative polarity, the first stable operating point of constant current is again attained and the cycle will repeat upon the application of the next positive trigger pulse.

For monostable circuit operation, the time constant of the circuit will be determined by the resistor 18 and the capacitor 34. The load line will then be chosen to be as shown by the dotted line A, which is designated as "monostable" in Figure 2. The transistor 38 will be initially biased at cutoff and at a collector voltage as shown by the intersection of the load line A with the collector characteristic curve. In this cutoff condition, and assuming that the capacitor 34 is initially charged, the application of a positive pulse to the collector 44 will cause the collector load line to move from A to B and into the negative resistance region. Accordingly, the capacitor 34 is immediately discharged through the collector-emitter circuit of the transistor 38. This is shown by the portion 47 of the collector output pulse in Figure 3.

The transistor, following the discharge of the capacitor 34, is in a region of high conduction and the capacitor 34 begins to charge through the resistor 18. This is shown by the portion 49 of the collector output pulse. The charging of the capacitor 34 continues in this state until the collector voltage becomes positive enough to cause the operating point to shift into the negative resistance region. The capacitor 34 then charges at a rapid rate as shown by the portion 51 of the collector output pulse until the stable cutoff condition is again attained. The cycle then repeats upon the application of the next positive trigger pulse to the circuit.

Thus, for the case where the trigger pulses are applied to the collector of the transistor to provide monostable circuit operation, the load line is shifted during the circuit operation. In effect, therefore, for monostable operation of a circuit of the type shown in Figure 3, one stable operating region is provided. Since, however, the load line is shifted as described during the circuit operation, there is also an operating region which is quasi-stable. It should also be noted that the required time-constant for monostable operation, while preferably determined by a resistor and a capacitor as shown, may also be determined by other combinations of resistors and capacitors, by inductors or by suitable delay lines. This is also true for monostable circuit operation in all of the embodiments of the invention herein described.

Bistable and monostable circuit operation similar to that described in connection with Figure 1 may also be obtained by applying trigger pulses to the emitter electrode of the transistor. This is shown in Figure 4 of the drawing, where positive trigger pulses are applied to the emitter 12 of the P-N-P junction transistor 8. To this end, one of the input terminals 32 is connected through a coupling capacitor 34 to the emitter 12, the other input terminal 32 being as shown. If an N-P-N junction transistor were utilized, the polarity of the trigger pulses would, it should be understood, be negative.

It should also be understood that for bistable operation, the circuit may be turned on by the application of a pulse to another of its electrodes. Thus, for a junction transistor of the P-N-P type a negative pulse will turn the circuit on if applied to the collector or the base and turn it off if applied to the emitter. A positive pulse, on the other hand, will turn the circuit on if applied to the emitter and turn it off if applied to the collector or base. For a transistor of an opposite conductivity type (i.e., an N-P-N junction transistor) the positive and negative pulses will perform the functions of the negative and positive pulses respectively for the P-N-P transistor. In the case of monostable operation the pulses may also be applied to any one of the electrodes or any combination thereof so long as the polarity of the pulses is correct.

Figure 5:
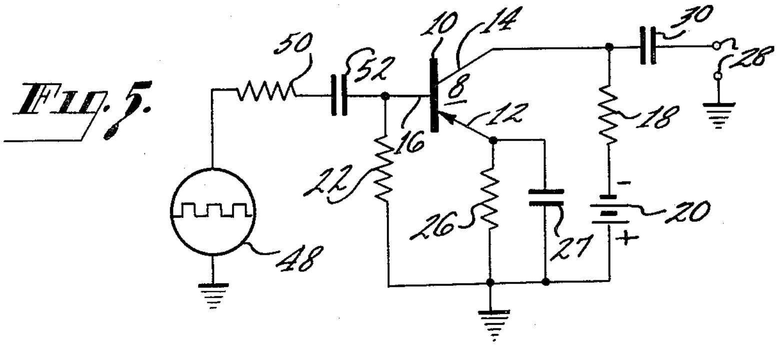
Figure 5 is a schematic circuit diagram of a frequency divider circuit utilizing a junction transistor and embodying the present invention.

One application of a junction transistor which is biased in accordance with the invention and whose circuit parameters are chosen so as to provide monostable circuit operation is a frequency divider. This is shown in Figure 5, wherein a square wave generator 48 is connected through a resistor 50 and a coupling capacitor 52 to the base of the P-N-P junction transistor 8. The circuit in other respects is similar to the one illustrated in Figure 1, except that the base 16 is returned to ground through a resistor 22. The emitter current flow through the resistor 26 initially provides the required reverse bias, therefore. The resistor 26 is also by-passed by a by-pass capacitor 27.

In operation, if a square wave having a frequency of 15 kilocycles is applied to the base 16 of the transistor 8 the output signal will have a frequency of 3.75 kilocycles if the following circuit parameters are used, thus providing frequency division of 4-to-1:

| | |
|---|---|
| Resistors 18, 22 and 50 ___ | 22,000, 100,000, and 90 ohms, respectively. |
| Resistor 26 _____________ | 1.5 megohms. |
| Battery 20 ______________ | 80 volts. |
| Capacitor 27 ____________ | 560 micromicrofarads. |

By proper choice of the circuit parameters, the ratio of the frequency of the output signal to the input signal may obviously be varied.

As described herein, the present invention is seen to provide efficient and reliable semi-conductor trigger circuits which utilize a single junction transistor as the active signal amplifying element. Fast rise times, high gains, highly efficient and reliable circuit operation and simple circuit connections characterize these circuits. Accordingly, the invention may find wide use wherever trigger circuits having these characteristics are desired or required.

What is claimed is:

1. A semi-conductor trigger circuit comprising, in combination, a transistor of the junction type including a base, an emitter and a collector electrode, an impedance element connected with said base electrode, load means connected with said collector electrode, means providing biasing voltages in the reverse direction between said collector and base electrodes and between said emitter and base electrodes to provide an operating range for said transistor which includes a stable state of low current conduction and a negative resistance region characteristic, and circuit means for applying trigger pulses to one of said base, emitter and collector electrodes for triggering said transistor from said stable state of low current conduction into said negative resistance region.

2. A semi-conductor trigger circuit as defined in claim 1, wherein said transistor is of the P-N-P junction type.

3. A semi-conductor trigger circuit as defined in claim 1, wherein said transistor is of the N-P-N junction type.

4. A semi-conductor trigger circuit as defined in claim 1, wherein said circuit means is connected with said base electrode.

5. A semi-conductor trigger circuit as defined in claim 1, wherein said circuit means is connected with said emitter electrode.

6. A semi-conductor trigger circuit as defined in claim 1, wherein said circuit means is connected with said collector electrode.

7. A semi-conductor trigger circuit comprising, in combination, a junction transistor including a base, an emitter and a collector electrode, means providing a point of reference potential in said circuit, a first impedance element serially connected between said base electrode and said point, a second impedance element connected between said emitter electrode and said point, load means connected with said collector electrode, means providing biasing voltages in the reverse direction between said collector and base electrodes and between said emitter and base electrodes to provide an operating range for said transistor which includes a stable state of low current conduction and a negative resistance characteristic, and circuit means for applying trigger pulses to one of said base, emitter and collector electrodes for triggering said transistor from said stable state of low current conduction into said negative resistance region.

8. A regenerative amplifier circuit comprising, in combination, a transistor of the junction type including a base, an emitter and a collector electrode, means providing biasing voltages in the reverse direction between said collector and base electrodes and between said emitter and base electrodes to provide a negative resistance characteristic for said transistor over a portion of its operating range, input circuit means for applying pulses to said base electrode, a first impedance element connected with said base electrode, a second impedance element connected with said emitter electrode, a third impedance element connected with said collector electrode having impedance of a magnitude to render said amplifier circuit monostable, and output circuit means connected with said collector electrode for deriving amplified pulses therefrom.

9. A monostable semi-conductor trigger circuit comprising, in combination, means providing a point of reference potential in said circuit, a junction transistor including a base, an emitter and a collector electrode, means including a source of potential connected with said base and emitter electrodes and providing a biasing voltage in the reverse direction therebetween and a negative resistance characteristic for said transistor over a portion of its operating range, a first resistor connected in series between said emitter electrode and said point of reference potential, a second resistor element connected with said collector electrode having resistance of a magnitude to render said trigger circuit monostable, and circuit means including a capacitor for applying trigger pulses to one of said base, emitter and collector electrodes.

10. A bistable semi-conductor trigger circuit comprising, in combination, a point of reference potential, a junction transistor including a base, an emitter and a collector electrode, means including a source of potential connected with said base and emitter electrodes and providing a biasing voltage in the reverse direction therebetween to provide a negative resistance characteristic for said transistor over a portion of its operating range, a first impedance element connected in series between said base electrode and said source, a second impedance element connected in series between said emitter electrode and said point of reference potential, a third impedance element connected with said collector electrode and having impedance of a magnitude to render said trigger circuit bistable, and circuit means for applying trigger pulses to one of said base, emitter and collector electrodes.

11. A semi-conductor frequency divider circuit comprising, in combination, a semi-conductor device of the junction type including a base, an emitter and a collector electrode, a first impedance element connected with said base electrode, a second impedance element connected with said emitter electrode, means providing a biasing voltage in the reverse direction between said emitter and base electrodes to provide a negative resistance characteristic for said device over a portion of its operating range, a third impedance element connected with said collector electrode, input circuit means for applying pulses of one frequency to the base electrode of said device, and output circuit means connected with said collector electrode for deriving therefrom pulses of another and lower frequency.

12. A semi-conductor trigger circuit comprising, in combination, means providing a point of reference potential in said circuit, a junction transistor including a base, an emitter and a collector electrode, a first impedance element connected in series between said base electrode and said point of reference potential, a second impedance element connected in series between said emitter electrode and said point of reference potential, means providing a biasing voltage in the reverse direction between said emitter and base electrodes to provide an operating range for said transistor which includes a negative resistance characteristic and a stable state of low current conduction, means including a source of potential for biasing said collector electrode in the reverse direction with respect to said base electrode, a third impedance element connected in series between said collector electrode and said source, and circuit means for applying trigger pulses to one of said base, emitter and collector electrodes for triggering said transistor from said stable state of low current conduction into said negative resistance region.

13. A bistable semi-conductor trigger circuit comprising in combination, a semi-conductor device of the junction type including a base, an emitter and a collector electrode, a first impedance element connected with said base electrode, a second impedance element connected with said emitter electrode, means providing a biasing voltage in the reverse direction between said collector and base electrodes, means providing a biasing voltage in the reverse direction between said emitter and base electrodes to provide a negative resistance operating region for said device, circuit means for applying trigger pulses to one of said base, emitter and collector electrodes to trigger said device from a stable state of low current conduction, upon the application of a trigger pulse to a negative resistance region, and thereafter to another stable state of high current conduction.

14. A bistable semi-conductor trigger circuit comprising, in combination, a transistor of the junction type including a base, an emitter and a collector electrode, a first impedance element connected with said base electrode, a second impedance element connected with said emitter electrode, means providing a biasing voltage in the reverse direction between said emitter and base electrodes to provide a stable state of low current conduction and a negative resistance characteristic for said transistor over a portion of its operating range, a third impedance element connected with said collector electrode and proportioned to render said trigger circuit bistable, and circuit means for applying trigger pulses to one of said base, emitter and collector electrodes for triggering said transistor from said stable state of low current conduction into said negative resistance region.

15. A semi-conductor frequency divider circuit comprising, in combination, means providing a point of reference potential in said circuit, a junction transistor including a base, an emitter and a collector electrode, a first impedance element connected in series between said base electrode and said point of reference potential, a second impedance element connected in series between said emitter electrodes and said point of reference potential to provide a biasing voltage in the reverse direction between said emitter and base electrodes and a negative resistance characteristic for said transistor over a portion of its operating range, means including a source of potential providing a biasing voltage in the reverse direction between said collector and base electrodes, a third impedance element connected in series between said collector electrode and said source of potential and proportioned to render said frequency divider circuit monostable, input circuit means including a capacitor for applying pulses of one frequency to the base electrode of said device, and output circuit means connected with said collector electrode for deriving therefrom pulses of another and lower frequency.

16. A monostable semi-conductor trigger circuit comprising, in combination, a semi-conductor device of the junction type including a base, an emitter and a collector electrode, a first impedance element connected with said base electrode, a second impedance element connected with said emitter electrode, means providing a biasing voltage in the reverse direction between said emitter and base electrodes to provide a negative resistance region characteristic for said device over a portion of its operating range, a third impedance element connected with said collector electrode and proportioned to render said trigger circuit monostable, and circuit means including a capacitor for applying trigger pulses to one of said base, emitter and collector electrodes for triggering said device from a stable state of low current conduction into said negative resistance region.

17. A bistable semi-conductor trigger circuit comprising, in combination, means providing a point of reference potential in said circuit, a semi-conductor device of the junction type including a base, an emitter and a collector electrode, a first impedance element connected with said base electrode, a second impedance element serially connected between said emitter electrode and said point of reference potential, a third impedance element connected with said collector electrode, means providing a biasing voltage in the reverse direction between said collector and base electrodes, means providing a biasing voltage in the reverse direction between said emitter and base electrodes to provide a negative resistance operating region for said device, circuit means for applying trigger pulses to one of said base, emitter and collector electrodes to trigger said device from a stable state of low current conduction upon the application of a trigger pulse to a negative resistance region and thereafter to another stable state of high current conduction.

References Cited in the file of this patent

UNITED STATES PATENTS

| | | |
|---|---|---|
| 2,531,076 | Moore | Nov. 21, 1950 |
| 2,595,208 | Bangert | Apr. 29, 1952 |
| 2,605,306 | Eberhard | July 29, 1952 |
| 2,622,211 | Trent | Dec. 16, 1952 |
| 2,629,833 | Trent | Feb. 24, 1953 |
| 8,644,896 | Lo | July 7, 1953 |
| 2,705,287 | Lo | Mar. 29, 1955 |
| 2,709,787 | Kircher | May 31, 1955 |
| 2,764,642 | Shockley | Sept. 25, 1956 |
| 2,790,034 | McAfee | Apr. 23, 1957 |
| 2,830,199 | Moferson | Apr. 8, 1958 |